(12) United States Patent
Shi et al.

(10) Patent No.: US 7,454,586 B2
(45) Date of Patent: Nov. 18, 2008

(54) MEMORY DEVICE COMMANDS (75) Inventors: Jun Shi, San Jose, CA (US); Sandeep Jain, Milpitas, CA (US); Animesh Mishra, Pleasanton, CA (US); Kuljit Bains, Olympia, WA (US); David Wyatt, San Jose, CA (US); Thomas D. Skelton, San Jose, CA (US); Bill H. Nale, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 353 days.

(21) Appl. No.: 11/093,705

(22) Filed: Mar. 30, 2005

(65) Prior Publication Data
US 2006/0239095 A1    Oct. 26, 2006

(51) Int. Cl.
*G06F 12/00* (2006.01)
*G06F 13/00* (2006.01)

(52) U.S. Cl. .................. 711/167; 711/106; 365/212; 700/299

(58) Field of Classification Search ............. 711/106
See application file for complete search history.

(56) References Cited

U.S. PATENT DOCUMENTS

| | | | |
|---|---|---|---|
| 5,682,498 A | | 10/1997 | Harnes et al. |
| 5,937,170 A | * | 8/1999 | Bedarida ............... 710/100 |
| 6,021,076 A | * | 2/2000 | Woo et al. ............. 365/211 |
| 6,172,893 B1 | * | 1/2001 | Ryan ..................... 365/49 |
| 6,453,218 B1 | * | 9/2002 | Vergis ................... 700/299 |
| 6,553,449 B1 | * | 4/2003 | Dodd et al. ............ 711/5 |
| 2003/0021145 A1 | * | 1/2003 | Tran ...................... 365/171 |
| 2003/0123319 A1 | * | 7/2003 | Kim ...................... 365/233 |
| 2003/0235101 A1 | * | 12/2003 | Tanaka et al. ......... 365/203 |
| 2005/0007864 A1 | * | 1/2005 | Chung et al. .......... 365/232 |
| 2005/0144372 A1 | * | 6/2005 | Walker .................. 711/105 |

OTHER PUBLICATIONS

Gillingham, P. et al., "SLDRAM: High-Performance, Open-Standard Memory" IEEE Micro, IEEE Service Center, Los Alamitos, CA. US., vol. 17, No. 6, Nov. 1997, pp. 23-39, XP000726002, ISSN: 0272-1732, p. 34.
PCT Search Report, PCT/US2006/012995, Date mailed Sep. 1, 2006, Applicant: Intel Corporation.

* cited by examiner

*Primary Examiner*—Matt Kim
*Assistant Examiner*—Michael C Krofcheck
(74) *Attorney, Agent, or Firm*—Blakely, Sokoloff, Taylor & Zafman LLP

(57) ABSTRACT

Data regarding physical parameters and security and commands to send such data can be communicated between a memory device and a memory controller using a memory bus connected between the two. In one embodiment, the invention includes receiving a first command at a memory device on a memory bus, the first command being other than a read or write command, and receiving a second command together with the first command, the second command to be initiated using lines that are not used by the first command.

19 Claims, 4 Drawing Sheets

MEMORY DEVICE COMMANDS

BACKGROUND

1. Technical Field

The present disclosure relates to bus communications with memory devices, in particular, to communicating memory system parameters and characteristics across a system memory bus.

2. Related Art

The temperature of a semiconductor memory, such as a RAM (random access memory) is largely determined by its activity level (rate of reads and writes into the memory cells) and its environment. If the temperature becomes too high, then the data stored in the memory may be corrupted or lost. In addition, at higher temperatures, power consumption may increase. In addition, as the temperature of a solid state memory increases, the memory loses charge at a faster rate. If the memory loses charge, then it loses the data that was stored in its memory cells. RAM chips have self-refresh circuitry that restores the lost charge at periodic intervals. As the temperature increases the self-refresh rate must be increased in order to avoid losing the data.

In order to keep the refresh rates low and to avoid damage to the memory or loss of data, some information about the memory temperature must be known. The more accurate the temperature information, the hotter the memory may be permitted to run and the lower the refresh rate may be without risk of data loss. If the temperature information is not reliable or accurate, then the memory will be run at a slower access rate or a faster refresh rate than necessary in order to provide some margin for error. In other words by increasing accuracy, the guard band for temperature control can be reduced. This allows the performance of the memory to be increased. Accurate temperature information may also be used to control cooling fans and other thermal controls.

Memory is often packaged in modules that contain several similar or identical IC (Integrated Circuit) chips, such as DRAM (Dynamic Random Access Memory) chips. The temperature of each chip may be different, depending on its level of use, available cooling and its own unique characteristics. Other devices on the memory module may have different temperatures as well. To be effective, the temperature information should be provided to some system that adjusts parameters of the memory, such as data transfer rates, clock rates, thermal control systems, such as fans, and the self-refresh rate.

In order to accurately monitor all aspects of such a memory module, expensive resources must be used to transfer all of the temperature information to a device that can interpret the information and cause some action to be taken, if necessary. The greater the number of temperature readings and the more frequently they are collected, the greater the resources needed to supply the demand. There are also many other system parameters and characteristics that may need to be communicated from memory regarding error detection, security, usage, etc. The existing communications resources used to connect system memory to a memory controller are used to send data to be read from and written to the memory banks. Any additional circuitry or communication interfaces may significantly increase the cost of the memory module.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

Figure 1:
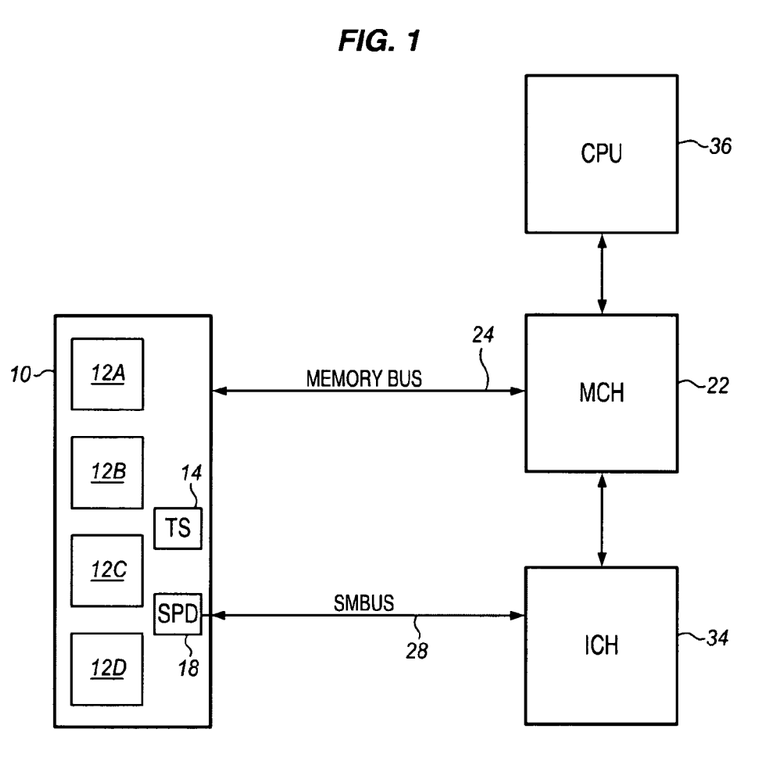
FIG. 1 is a block diagram of a portion of a computer system including a memory module and a memory controller according to an embodiment of the invention.

FIG. 1 shows a memory unit 10 that has a plurality of memory devices 12 (12a-12n) and a temperature measurement module 14 coupled to the memory devices 12. The memory unit 10 may be a SO-DIMM (small outline dual inline memory module) of the type typically used in notebook personal computers (PCs). The SO-DIMM 10 may have a 240-pin, 144-pin, or 72-pin configuration that supports 64-bit transfers, or any other of a wide variety of different pin configurations for different transfer rates that correspond to a DIMM (Dual In-line Memory Module) structure or any other structure. The memory unit 10 may alternatively be a micro DIMM, or a full-size DIMM, more commonly used in desktop PCs. Furthermore, the memory devices 12 may be SDRAM (synchronous dynamic random access memory) devices, which have relatively high current surge transients and can therefore be highly susceptible to overheating. Embodiments of the present invention may be applied, however, to any type of memory device that is sensitive to temperature.

The memory unit includes several SDRAM devices 12a, 12b, 12c, 12d. While four SDRAM devices have been shown, a greater or smaller number of memory devices may be used. A temperature measurement module 14 measures an internal temperature of one or more of the memory devices 12 either directly or indirectly. The temperature measurement module may use thermal sensors in one or more of a variety of different locations. In one embodiment, each DRAM has its own independent temperature sensor, rather than there being a common temperature sensor for each DRAM. In another embodiment, some portions of the temperature sensor reside on each DRAM and other portions reside in a common unit. While the present invention is described in the context of a DIMM carrying a set of DRAMs, it may be applied to a wide range of other configurations. For example, one or more DRAMs may be directly coupled to a bus without using a module to carry them, or the DRAMs may be carried on some device other than a DIMM.

The memory unit 10 is coupled to an MCH (memory controller hub) 22, though a memory bus 24, and a serial presence detect (SPD) device 18 of the memory unit is coupled to an ICH (Input/Output Controller Hub) 34 through a SMBus 28. The SPD stores configuration information (e.g., module size, data width, speed and voltage) used by the basic input/output system (BIOS, not shown) at system start-up. It transfers data through a system management bus (SMBus) 28 coupled to the SPD device 18. The thermal sensor 14 may be integrated into the SPD or implemented as a separate component. In one example, the system management bus 28 is an I2C (inter integrated circuit) bus (e.g., I2C Specification, Version 2.1, Phillips Semiconductors, January 2000), which can physically consist of two active wires and a ground connection. The active wires, termed serial data line (SDA) and serial clock line (SCL) are both bidirectional.

The system management bus 28 can also operate under an SMBus framework (e.g., SMBus Specification, Version 2.0, SBS Implementers Forum, August 200). An SMBus interface uses I2C as its backbone, and enables components to pass messages back and forth rather than tripping individual control lines. Such an approach is particularly useful for a system memory in a personal computer architecture.

The ICH is coupled to the MCH and also to a CPU (Central Processing Unit) 36 which sends data to and fetches data from the system memory 10. In the illustrated embodiment, the system memory sends and receives memory data to and from the MCH and the MCH controls the memory's read and write cycles as well as its refresh rates. A system memory bus 24 connecting the MCH and the system memory may carry commands and addresses as well as data read from or written to the memory.

The ICH communicates stored data from the system memory to other devices (not shown). Any one or more of these three devices may be consolidated into a single unit. The MCH may be incorporated into the CPU or the ICH and the functions of all three devices may be combined into a single chip. The sensed temperature from the ICH can be sent to the MCH or the CPU which may then adjust the refresh rate or take other actions.

There are a variety of different standards for memory devices and for the links that allow memory devices to be read to and written from. One such standard is the JEDEC Solid State Technology Association standard for DDR2 SDRAM JESD79-2A (January 2004). This standard assigns functions to the various pins of the communications bus and sets values to be used in communications across the bus. Other standards may assign functions and values in a similar way. The DDR2 SDRAM standard, mentioned above, assigns the connections of a DRAM chip as follows:

CKClock Input
CKE Clock Enable
CS Chip Select: CS provides for external rank selection
ODT On Die Termination
RAS, CAS, WE Command Inputs: Defines the command being entered.
DM (UDM), (LDM)Input Data Mask
BA0-BA2 Bank Address Inputs
A0-A15 Address Inputs: Provides the row and column address for commands.
DQData input/output for the bi-directional data bus.
DQSData Strobe
NC No Connect: No internal electrical connection is present.
VDDQ DQ Power Supply
VSSQ DQ Ground
VDDL DLL Power Supply
VSSDLDLL Ground
VDD Power Supply
VSSPower Supply Ground
VREFReference voltage Using these pins a variety of different commands and functions may be provided. These may include, bank activation, read and write access modes, precharge, auto precharge, refresh, self refresh, power-down, asynchronous CKE low events, input clock frequency change during precharge power down, no operation commands, and deselect commands. Different ones of the pins or connectors described above are used for different commands. In for example, refresh, self-refresh, power down and clocking commands, the address lines are not used. In addition, for some commands, such as read and write modes, the data lines are used, while for other commands, such as bank activation and refresh, the data lines are not used.

In one embodiment of the invention, the DRAM data bus address lines may be used to initiate commands during a refresh cycle an the DRAM data bus outputs may be used to deliver device information during the refresh cycle. Refresh cycles are periodically performed to maintain the contents of memory but the memory cells do not provide any data on the data bus during the cycle. This available, unused bandwidth may be used to provide other types of information from each DRAM.

The available data bus bandwidth may be used to allow each DRAM to provide temperature information without adding new signals or adding new DRAM commands that consume command bandwidth. Other types of DRAM device information may also be sent on command, such as register programming. As an example, for current DRAM standards such as DDR, DDR2 and DDR3, an auto refresh command cycle is used to command the DRAM memory cells to perform a refresh. The command sends no other information or commands to the DRAMs and the DRAMs provide no information back to the memory controller.

By applying extra information to the DRAM address lines, additional commands may be delivered to the DRAMs together with the auto refresh command. This command may be used to indicate that a specified kind of device information should be driven on the data bus by the DRAM device using an appropriate time slot. The kind of information to be delivered may be specified by setting individual address signals to a logic zero or one during the delivery of the auto refresh command. A similar approach may be used with other commands in addition to auto refresh that do not otherwise require the use of certain lines.

Considering the example of the auto refresh command more specifically, this command does not set any requirements for the use of the BA00-02 lines nor for the A0 to A15 lines. In other words, these lines may be set to any value without affecting the auto refresh command. In one example, the memory controller sends the auto refresh command and then sets address line A10 to a specific value. Address line A10 may be defined for telling the DRAMs whether to do a normal auto refresh or to send thermal data on the data bus before doing the auto refresh. So, for example, when A10 is "0", the DRAMs may treat the auto refresh command as a normal one. When A10 is "1", the DRAMs first send out thermal data on the data bus for the memory controller to read back and then do an auto refresh. In this way a thermal data read command may be initiated on the address lines.

By using A10 to command the DRAMs to read out thermal data, the thermal data can be acquired by the memory controller without any impact on the read and write access times for the memory. In addition, unused memory bus capacity is used, avoiding any need for a different or additional bus for temperature information. As mentioned above, while the auto refresh command is used as an example in the context of DDR standards, other commands may be used for this and for other types of memory standards. The additional commands may be enabling by setting a specific mode register bit in a DRAM using the Mode Register Set command. The Mode Register Set Command is provided for in the DDR memory standards, mentioned above.

After a command to provide information has been received by the memory devices, the requested information may be returned in any of a variety of different ways. A special connector or bus may be provided for the requested information or the information may be provided together with other information in accordance with a protocol or exchange that is already part of the communications and control standard. In one embodiment, the requested information is provided on associated data lines in direct response to the request being received on the command lines. In the DDR standard memory bus, a bi-directional data bus (DQ) is provided. Temperature information from each DRAM may be sent directly to the memory controller on the DQ bus in the same way or in a similar way that stored memory data is sent to the memory controller.

Newer technology memory data buses allow for a large amount of temperature data to be sent for each memory device or DRAM chip. The temperature data may be for a single temperature, multiple temperatures taken at different times, multiple temperatures taken at different locations in the chip or for any other temperature information. If the standard DQ bus for DDR3 memory is used, each DRAM sends 4 bits per clock on each of its 64 pins. During a burst cycle, there are 4 clocks, so 64 8-bit bytes of data may be received from each DRAM. 64 bytes may be used to represent several temperature measurements to a very high accuracy. Since DRAM devices come in different data bus widths (x4, x8, x16) it may be possible to select more than one field of device information be delivered on the wider data bus devices. For example, a x8 device will deliver twice as much data in a single cycle as a x4 device so two separate 8 bit device data fields could be supplied in the same time that a single 8 bit field could be delivered by a x4 device.

For Single Rank Modules, information is received on each clock in a nibble format. In the standards for DDR3, a burst has 8 clocks for most mobile and desktop applications, this allows for up to 8 nibbles of data at one nibble per clock to represent the temperature of the thermal sensor on each DRAM. At 4 bits per nibble, 32 bits are provided using standardized bursts and the allocated number of pins for different memory configurations still allows for very high accuracy. For Double Rank Modules, there are twice as many separate DRAM devices. This still allows 16 bits of temperature data for each DRAM, amounting to more than 65,000 gradations of temperature. Alternatively, the 64-bit accuracy may be maintained by using two read cycles or half as many DRAMs may be queried for temperature. Other variations may be accommodated making similar modifications.

Figure 2:
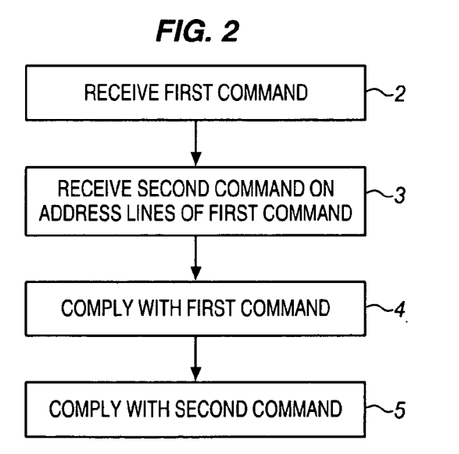
FIG. 2 is process flow diagram of sending commands according to an embodiment of the invention.

FIG. 2 shows a generalized flow of events for acquiring temperature data using a memory bus. In block 2, a first command is received at a memory module on the system memory bus. The first command may be any of a variety of different commands that do not use all of the address lines. These lines are identified above as lines A0 to A15. Typically these commands are any commands other than read or write commands. In the DDR command structure, one such command is the auto refresh command. In other command structures other commands may be used.

In block 3, a second command is received together with the first command. As described above, the second command may be initated using lines, such as address lines that are not used by the first command. In the specific example above, one such line in the auto refresh command is the A10 line, however, other lines may be used instead.

In block 4, the memory module complies with the first command by, for example, performing an auto refresh, and in block 5, the memory module complies with the second command by, for example, sending temperature values. These operations may be performed in any order depending on the nature of the commands. In the example of an auto refresh and a temperature values read, the temperature values may be read first in order to provide a faster response.

Figure 3:
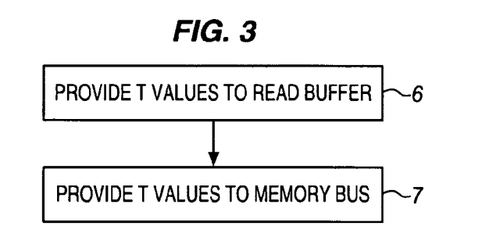
FIG. 3 is process flow diagram of sending temperature values according to an embodiment of the invention.

FIG. 3 shows operations that may be performed to provide temperature data to an external device across a system memory bus. The temperature information may be provided in response to a command or based on internal events or timing. In block 6, the temperature values are provided from a thermal sensor system of a memory module to a memory data read buffer of the memory module. This data read buffer may provide an interface to the memory bus. In block 7, the temperature values are provided from the memory data read buffer to the system memory bus in the data format of the memory bus. This format may involve nibbles of data sent during data read bursts.

Figure 4:
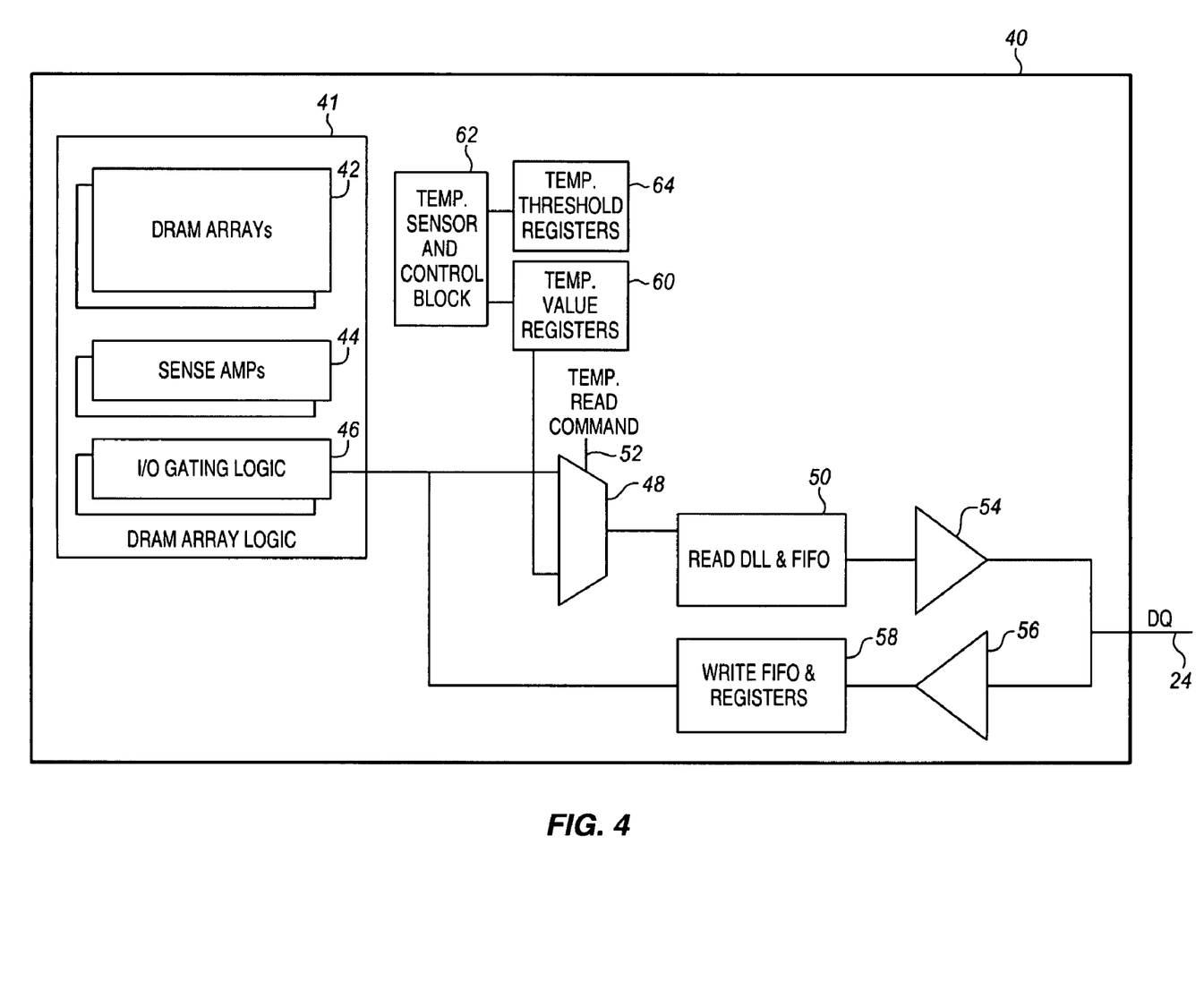
FIG. 4 is a block diagram of a memory device according to an embodiment of the invention.

FIG. 4 shows an example of a memory device, such as one of the DRAM chips 12 of FIG. 1 adapted to provide temperature information on a data bus as described above with respect to FIGS. 2 and 3. In FIG. 4, The memory device 40 has a set of memory blocks 41. Each block has a set of memory bank arrays 42 to store data, sense amplifiers 44 coupled to the memory arrays to drive the stored data onto read lines, and I/O (input/output) gating logic 46 to transfer the data out of the DRAM chip.

When stored memory data is read onto the memory bus 24 to be sent to the memory controller, the stored data is applied by the I/O gating logic to a multiplexer that combines the data into nibbles and to a read buffer 50. When a read command 52 is strobed onto the multiplexer, the data is applied to the buffer 50, from which it is amplified in a line amplifier 54 and sent across the bus. The buffer 50 includes DLLs (Delay Locked Loops) and FIFOs (First In First Out Buffers) to adjust input timings for the data strobe signals as well as to fine tune the timing of all the output signals. The buffer may have a set of delay elements that may be calibrated to match up with the reference clock.

Similarly data from the memory controller that is to be written into a DRAM address is amplified in the memory device by an amplifier 56 coupled to the memory bus and applied to a set of write buffers 58. From the write buffers, the data is applied to the I/O gating logic of the appropriate memory block.

In order to send temperature measurements instead of stored data on the memory bus, a set of temperature registers 60 may be applied to the same multiplexer 48 on the memory device that receives the data from the DRAM memory blocks. When a command is received to send temperature data, the temperature registers are read from and coupled to the multiplexer which switches over to send stored temperature measurements instead of stored data. The temperature values may be applied then to the read buffer 50 and then amplified onto the memory bus in the same way that any data would be. By applying the temperature data to the read data buffer, the existing timing and signal logic used for standard data operations may be used. This simplifies the memory device and ensures that the temperature measurements are reliably transmitted.

FIG. 4 also shows a simplified version of a portion of the temperature measurement system of the memory device. In FIG. 4, a temperature sensor and control block 62 collects temperature information from one or more locations on the device. In one embodiment, a temperature is measured from a sensor on each one of the DRAM blocks. These temperatures are converted to digital values that can be sent over the memory bus 24 by the temperature sensor and control block 62. This block may also compare the temperatures to thresholds stored in a threshold register 64. The threshold comparison may be used to generate flags or alerts or for other monitoring purposes. The thresholds may be preprogrammed, set by the memory device, set by the memory module, or set remotely through commands on the memory bus.

Figure 5:
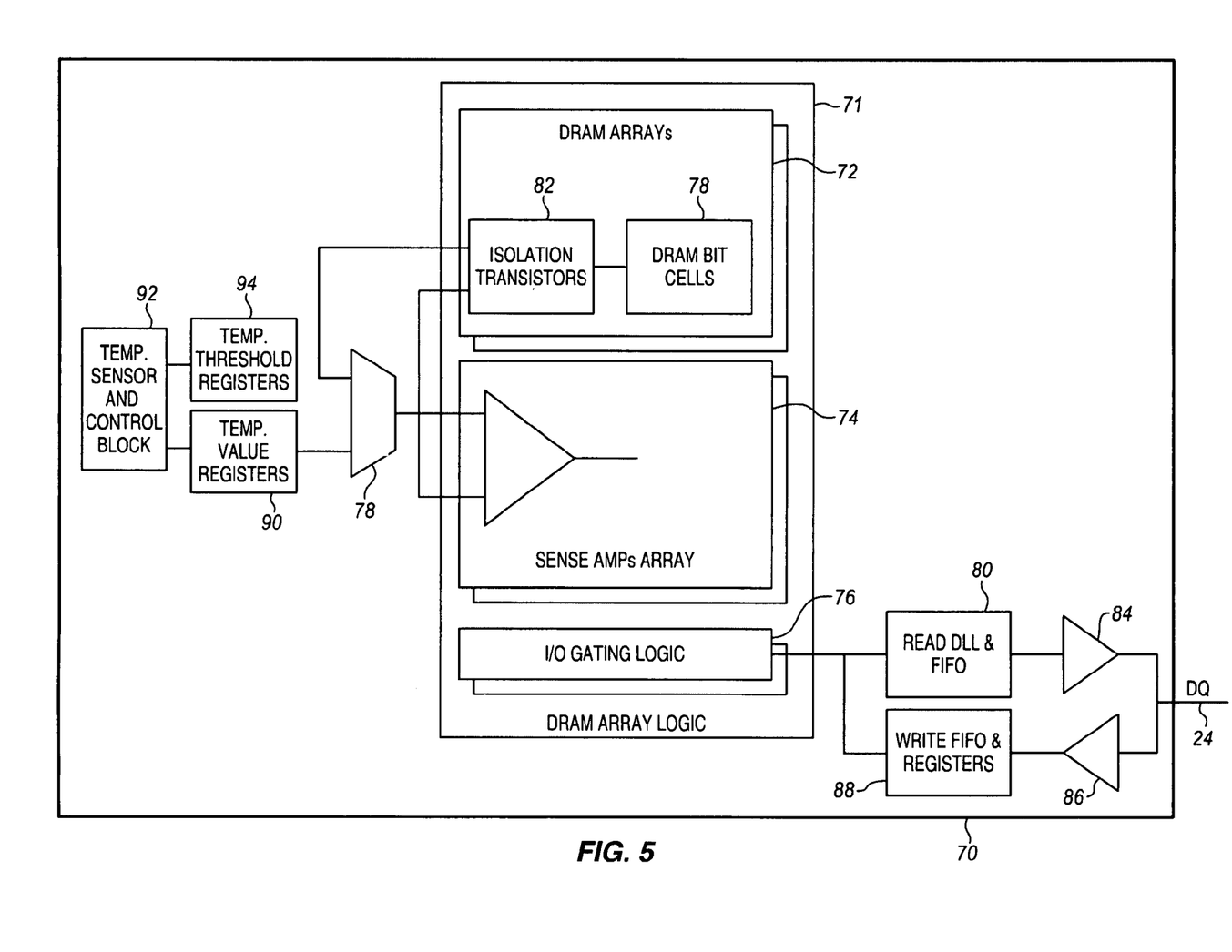
FIG. 5 is a block diagram of an alternative memory device according to an embodiment of the invention.

FIG. 5 shows another example of a memory device, such as a DRAM chip adapted to provide temperature information on a data bus as described above with respect to FIG. 4. In FIG. 5, the memory device 70 has a set of memory blocks 71. Each block has a set of memory bank arrays 72 to store data, a set of sense amplifiers 74 coupled to the memory arrays to drive the stored data onto read lines, and I/O (input/output) gating logic 76 to transfer the data out of the DRAM chip.

Stored memory data is read out of individual memory cells 78, through isolation transistors 82 and into amplifiers of the sense amplifier arrays. The isolation transistors protect the data on the individual memory cells from being corrupted by other activity in the amplifiers and other components. It is applied the memory bus 24 from the sense amplifiers by the I/O gating logic that sends data to a read buffer 90. The data is amplified in a line amplifier 84 and sent across the bus. Data to be written into a DRAM address is amplified in the memory module by an amplifier 86 coupled to the memory bus and applied to a set of write buffers 88. From the write buffers it is applied to the I/O gating logic of the appropriate memory block.

The memory device also contains a temperature sensor and control block 92 coupled to threshold registers 94 and temperature value registers 90. When the temperature value registers are to be read, they are applied to a multiplexer 78. This multiplexer is interposed between the individual memory bit cells and the sense amp logic and may be switched to provide either stored memory data or temperature values in a manner similar to the multiplexer 48 of FIG. 4. By sending temperature data through the sense amps instead of directly to the read buffer, as in FIG. 4, the benefits of the sense amp components and the I/O gating logic can be used. This further enhances the reliability of the temperature communications and reduces duplication of equipment for temperature data. In the configuration of FIG. 5, temperature registers can be made part of the DRAM memory arrays 72. The temperature values may be stored into extended memory cells, and special addresses may be used to send the temperature values to the I/O gating logic 76. The examples of FIGS. 4 and 5 may be modified to suit any particular application. In addition, embodiments of the present invention may be applied to other types of memory devices and systems.

Figure 6:
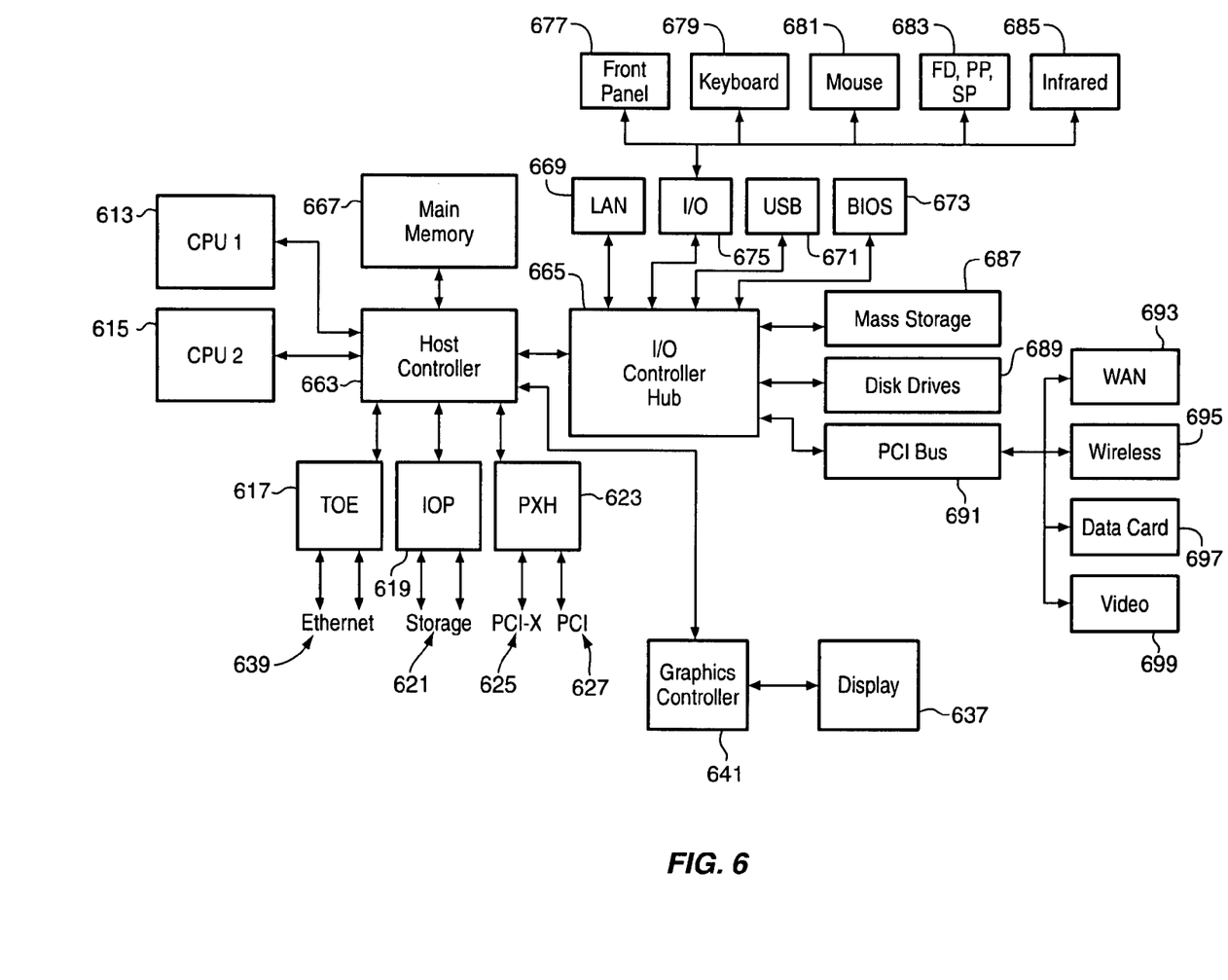
FIG. 6 is a block diagram of a computer system suitable for implementing embodiments of the present invention.

FIG. 6 shows an example of a computer system suitable for incorporating an embodiment of the present invention. A MCH chip, north bridge, or host controller 663 interfaces one or more CPUs (central processing unit) 613, 615 with memory and I/O devices and may provide a wide range of features such as increased performance, reliability, availability and serviceability, system management and hot plug exchange of CPUs. The MCH may include I/O clusters, a memory controller, snoop filters, and a wide range of logic for handling transactions. While the example of FIG. 6 includes a microprocessor coupled to a MCH and an ICH (Input/Output Controller Hub) 665, either the MCH or the ICH or both or any of the functions of these chips may be incorporated into the microprocessors. The MCH and the ICH may also be combined, in whole or in part, inside of or outside of the microprocessor.

In the example of FIG. 6, the MCH 611 has a pair of FSBs (front side bus) each coupled to a CPU or processor core 613, 615. More or less than two processor cores and FSBs may be used. Any number of different CPUs and chipsets may be used. The north bridge receives and fulfills read, write and fetch instructions from the processor cores over the FSBs. The north bridge also has a system memory bus, such as bus 24 of FIG. 1 to system memory 667, such as DIMMs (Dual In-line Memory Modules) similar to the one shown in FIG. 1, in which instructions and data may be stored, and an interface to an ICH (input/output controller hub) 665.

The MCH also has an interface, such as a PCI (peripheral component interconnect) Express, or AGP (accelerated graphics port) interface to couple with a graphics controller 641 which, in turn provides graphics and possible audio to a display 637. The PCI Express interface may also be used to couple to other high speed devices. In the example of FIG. 6, six x4 PCI Express lanes are shown. Two lanes connect to a TCP/IP (Transmission Control Protocol/Internet Protocol) Offload Engine 617 which may connect to network or TCP/IP devices such as a Gigabit Ethernet controller 639. Two lanes connect to an I/O Processor node 619 which can support storage devices 621 using SCSI (Small Computer System Interface), RAID (Redundant Array of Independent Disks) or other interfaces. Two more lanes connect to a PCI translator hub 623 which may support interfaces to connect PCI-X 625 and PCI 627 devices. The PCI Express interface may support more or fewer devices than are shown here. In addition, while PCI Express and AGP are described, the MCH may be adapted to support other protocols and interfaces instead of, or in addition to those described.

The ICH 665 offers possible connectivity to a wide range of different devices. Well-established conventions and protocols may be used for these connections. The connections may include a LAN (Local Area Network) port 669, a USB hub 671, and a local BIOS (Basic Input/Output System) flash memory 673. A SIO (Super Input/Output) port 675 may provide connectivity for a front panel 677 with buttons and a display, a keyboard 679, a mouse 681, and infrared devices 685, such as IR blasters or remote control sensors. The I/O port may also support floppy disk, parallel port, and serial port connections. Alternatively, any one or more of these devices may be supported from a USB, PCI or any other type of bus or interconnect.

The ICH may also provide an IDE (Integrated Device Electronics) bus or SATA (serial advanced technology attachment) bus for connections to disk drives 687, 689 or other large memory devices. The mass storage may include hard disk drives and optical drives. So, for example, software programs, parameters or user data, may be stored on a hard disk drive or other drive. A PCI (Peripheral Component Interconnect) bus 691 is coupled to the ICH and allows a wide range of devices and ports to be coupled to the ICH. The examples in FIG. 6 include a WAN (Wide Area Network) port 693, a Wireless port 695, a data card connector 697, and a video adapter card 699. There are many more devices available for connection to a PCI port and many more possible functions. The PCI devices may allow for connections to local equipment, or nearby computers. They may also allow for connection to various peripherals, such as printers, scanners, recorders, displays and more. They may also allow for wired or wireless connections to more remote equipment or any of a number of different interfaces.

The particular nature of any attached devices may be adapted to the intended use of the device. Any one or more of the devices, buses, or interconnects may be eliminated from this system and others may be added. For example, video may be provided on the PCI bus, on an AGP bus, through the PCI Express bus or through an integrated graphics portion of the host controller.

It is to be appreciated that a lesser or more equipped memory unit, memory module, thermal sensor, thermal management, or computer system than the example described above may be preferred for certain implementations. Therefore, the configuration of the examples provided above may vary from implementation to implementation depending upon numerous factors, such as price constraints, performance requirements, technological improvements, or other circumstances. Embodiments of the present invention may also be adapted to other types of memory systems and to other thermal environments than the examples described herein. While the present invention is described in the context of requesting and sending memory data over a communications bus. Other types of data may be requested and sent. Examples of some other types of information include error detection and correction data, such as correctable or uncorrectable errors, commands to allow or restrict access to certain portions of the memory, pattern detection data, and access logs.

Embodiments of the present invention may be provided as a computer program product which may include a machine-readable medium having stored thereon instructions which may be used to program a general purpose computer, mode distribution logic, memory controller or other electronic devices to perform a process. The machine-readable medium may include, but is not limited to, floppy diskettes, optical disks, CD-ROMs, and magneto-optical disks, ROMs, RAMs, EPROMs, EEPROMs, magnet or optical cards, flash memory, or other types of media or machine-readable medium suitable for storing electronic instructions. Moreover, embodiments of the present invention may also be downloaded as a computer program product, wherein the program may be transferred from a remote computer or controller to a requesting computer or controller by way of data signals embodied in a carrier wave or other propagation medium via a communication link (e.g., a modem or network connection).

In the description above, numerous specific details are set forth. However, it is understood that embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

What is claimed is:

1. A method comprising:
receiving a first command at a memory device on command lines of a memory bus, the first command being other than a read or write command, the memory bus having separate command lines, address lines, and data lines; and
receiving a second command together with the first command, the second command being received on the address lines of the memory bus, the address lines not being used by the first command.

2. The method of claim 1, wherein the first command is an auto refresh command.

3. The method of claim 1, wherein the second command is a temperature value read command.

4. The method of claim 1, wherein the second command is indicated by setting an address pin of the first command as high or low.

5. The method of claim 1, wherein the second command is a command to read temperature values of the memory and supply the temperature values on the memory bus.

6. The method of claim 1, further comprising in response to the second command, providing temperature values from a thermal sensor system of the memory device on the memory bus in a data format of the memory bus.

7. The method of claim 6, wherein providing temperature values comprises providing nibbles of data during a data read burst cycle of the memory bus.

8. The method of claim 6, wherein providing temperature values comprises switching a multiplexer coupled between memory arrays of the memory device and a data read buffer from the memory arrays to temperature value storage registers.

9. The method of claim 6, wherein providing temperature values comprises switching a multiplexer coupled between memory arrays of the memory device and a sense amplifier of the memory device from the memory arrays to temperature value storage registers.

10. An article including a machine-readable medium containing data, that when executed by the machine, causes the machine to perform operations comprising:
receiving a first command at a memory device on command lines of a memory bus, the first command being other than a read or write command, the memory bus having separate command lines, address lines, and data lines; and
receiving a second command together with the first command, the second command being received on the address lines of the memory bus, the address lines not being used by the first command.

11. The article of claim 10, wherein the second command is indicated by setting an address pin of the first command as high or low.

12. The article of claim 10, wherein the second command is a command to read temperature values of the memory and supply the temperature values on the memory bus.

13. The article of claim 10, further comprising data, that when executed by the machine, causes the machine to perform further operations in response to the second command, comprising providing temperature values from a thermal sensor system of the memory device on the memory bus in a data format of the memory bus.

14. An apparatus comprising:
a memory device coupled to a memory bus, the memory bus having separate command lines, address lines, and data lines to receive a first command on the command lines of the memory bus, the first command being other than a read or write command; and
a temperature sensor control block to receive a second command, the second command to be sent together with the first command on the address lines of the memory bus, the address lines not being used by the first command.

15. The apparatus of claim 14, wherein the first command is an auto refresh command.

16. The apparatus of claim 14, further wherein the temperature sensor control block includes temperature value registers to store measured temperature values and wherein the temperature sensor and control block provides the temperature values to the memory bus in a data format of the memory bus.

17. An apparatus comprising:
a memory controller;
a memory bus coupled to the memory controller, the memory bus having separate command lines, address lines, and data lines; and
a memory device coupled to the memory bus to receive commands from the memory controller over the memory bus,
wherein the memory controller is to send a first command using the command lines of the memory bus and a second command together with the first command to the memory device, the second command to be sent using the address lines of the memory bus, the address lines not being used by the first command.

18. The apparatus of claim 17, wherein the first command is an auto refresh command.

19. The apparatus of claim 17, wherein the second command is a temperature measurement read command.

* * * * *